United States Patent
Santos Rodriguez et al.

(10) Patent No.: US 10,763,151 B2
(45) Date of Patent: Sep. 1, 2020

(54) WAFER CARRIER, METHOD FOR MANUFACTURING THE SAME AND METHOD FOR CARRYING A WAFER

(71) Applicant: Infineon Technologies AG, Neubiberg (DE)

(72) Inventors: Francisco Javier Santos Rodriguez, Villach (AT); Roland Rupp, Lauf (DE); Ronny Kern, Finkenstein (AT); Josef Unterweger, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 131 days.

(21) Appl. No.: 15/915,849

(22) Filed: Mar. 8, 2018

(65) Prior Publication Data
US 2018/0197766 A1    Jul. 12, 2018

Related U.S. Application Data

(63) Continuation of application No. 14/873,124, filed on Oct. 1, 2015, now Pat. No. 9,917,000.

(51) Int. Cl.
*H01L 21/683* (2006.01)
*B23B 31/30* (2006.01)

(52) U.S. Cl.
CPC ...... *H01L 21/6836* (2013.01); *H01L 21/6838* (2013.01); *B23B 31/307* (2013.01); *B23Q 2703/04* (2013.01)

(58) Field of Classification Search
CPC .......... H01L 21/6835; H01L 21/6836; H01L 21/6838; B23B 31/307; B23B 31/007; B23B 31/005; B25B 11/007; B25B 11/005; B23Q 2703/04

USPC ........................................................... 269/21
See application file for complete search history.

(56) References Cited

U.S. PATENT DOCUMENTS

| | | | |
|---|---|---|---|
| 4,138,304 A * | 2/1979 | Gantley | B28D 1/003 125/13.01 |
| 4,667,944 A | 5/1987 | Althouse | |
| 4,711,014 A | 12/1987 | Althouse | |
| 4,856,766 A | 8/1989 | Huberts | |
| 4,971,196 A | 11/1990 | Kitamura et al. | |
| 5,883,778 A | 3/1999 | Sherstinsky et al. | |
| 6,513,306 B1 | 2/2003 | Milano | |
| 6,541,989 B1 | 4/2003 | Norris et al. | |
| 7,632,374 B2 | 12/2009 | Ozono et al. | |
| 8,500,182 B2 | 8/2013 | Yang et al. | |
| 8,960,749 B2 * | 2/2015 | Fukano | B65G 47/91 294/188 |
| 10,090,186 B2 * | 10/2018 | Togashi | H01L 21/6838 |

(Continued)

FOREIGN PATENT DOCUMENTS

| | | | |
|---|---|---|---|
| WO | 2011084531 A2 | 7/2011 | |
| WO | 2011100204 A2 | 8/2011 | |
| WO | 2013175166 A1 | 11/2013 | |

*Primary Examiner* — Jason L Vaughan
(74) *Attorney, Agent, or Firm* — Slater Matsil, LLP

(57) ABSTRACT

A wafer carrier comprises a first foil, a second foil, and a chamber between the first and the second foil. The first foil has a perforation and is used for carrying the wafer. The first and the second foil are connected to each other so as to form the chamber. The chamber is configured to be evacuated to form a vacuum in the chamber, the vacuum causes an underpressure at the perforation, the underpressure forms a carrying force to the wafer to be carried.

18 Claims, 2 Drawing Sheets

(56) References Cited

U.S. PATENT DOCUMENTS

2004/0038498 A1    2/2004   Ozono et al.
2008/0308223 A1   12/2008   Sakairi et al.
2013/0140838 A1    6/2013   Wang et al.

* cited by examiner

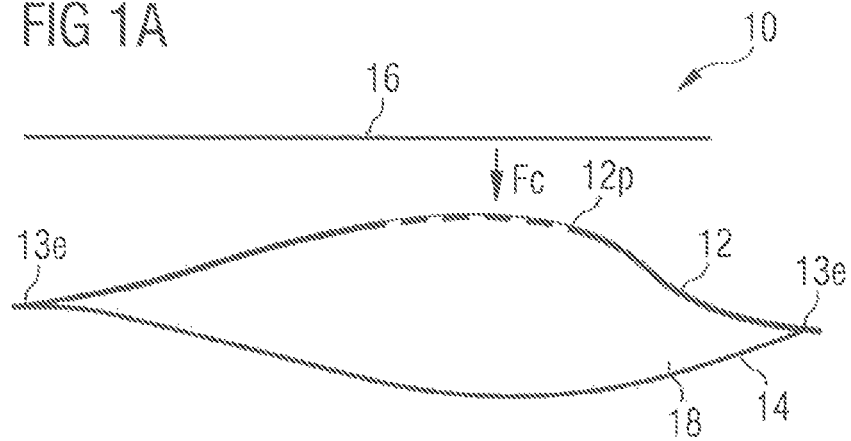
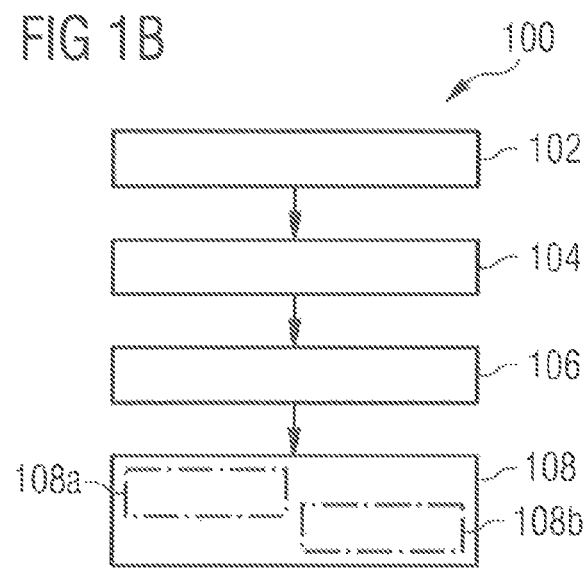
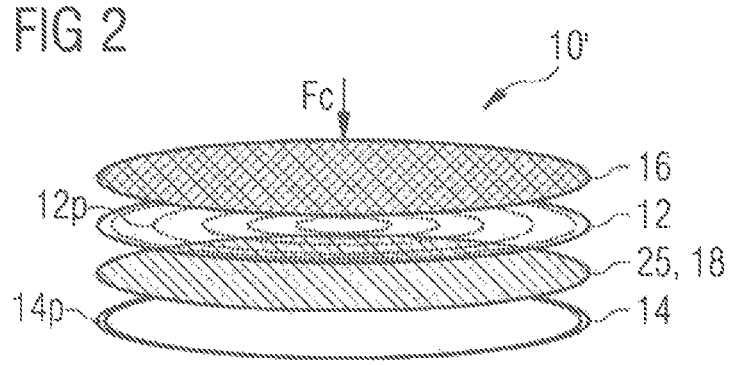

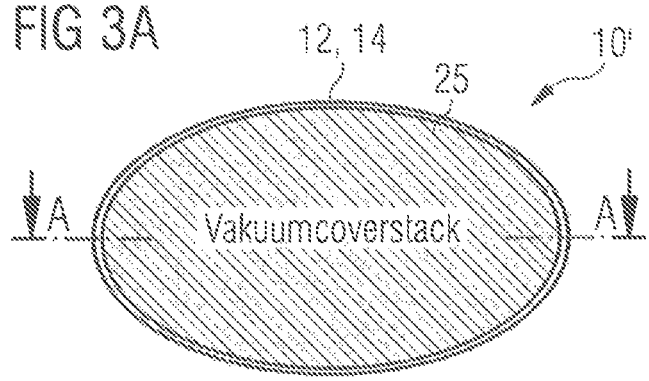
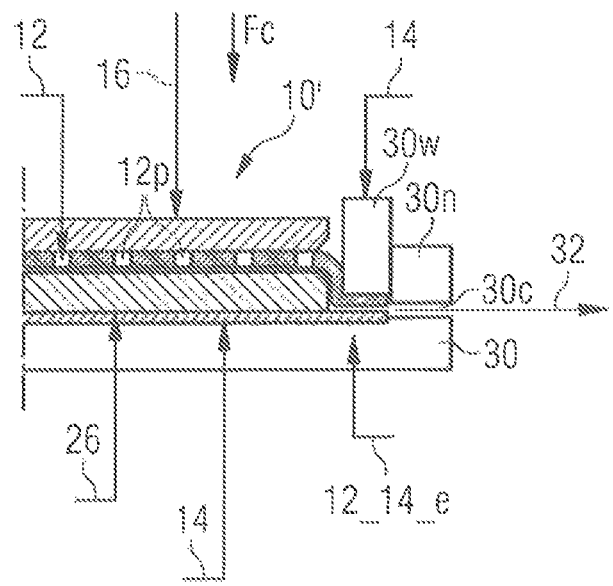
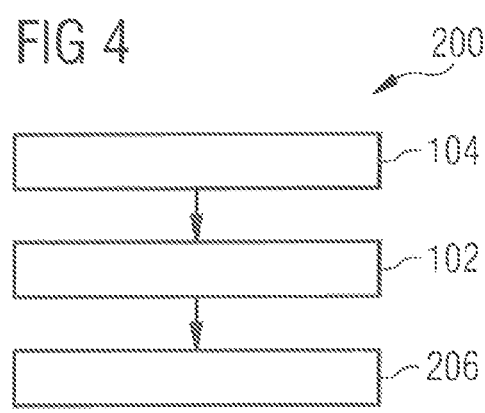

WAFER CARRIER, METHOD FOR MANUFACTURING THE SAME AND METHOD FOR CARRYING A WAFER

CROSS-REFERENCE TO RELATED APPLICATIONS

This application is a continuation of U.S. patent application Ser. No. 14/873,124, filed on Oct. 1, 2015, and entitled, "WAFER CARRIER, METHOD FOR MANUFACTURING THE SAME AND METHOD FOR CARRYING A WAFER", which application is hereby incorporated herein by reference.

TECHNICAL FIELD

Embodiments of the present invention relate to a wafer carrier, to a method for manufacturing a wafer carrier and to a method for carrying a wafer.

BACKGROUND

There are a plurality of concepts for carrying a wafer, like (vacuum) forceps or handling substrates or in general handling means. Examples for such handling means, also referred to as wafer support system, are adhesive films, available from the company 3M. Such wafer support systems have in common that the wafer is adhered to a foil or another substrate using an adhesive or adhesive pads. The usage of such adhesive layers typically causes adhesive residues remaining at the wafer. Additionally, such layers may cause a gassing product which could have a negative influence onto the wafer. For example, a change with regard to the adhesive properties with respect to metal layers of the semiconductor or growing properties with regard to semiconductor layers may be the result.

Therefore, there is a need for an improved approach.

SUMMARY

Embodiments of the invention provide a wafer carrier. The wafer carrier comprises a first foil for carrying the wafer, the first foil having a perforation, and a second foil. Furthermore, a chamber between the first and second foil is formed, wherein the first and second foils are connected to each other so as to form the chamber. The chamber is configured to be evacuated to form a vacuum in the chamber, the vacuum causes an underpressure (or low pressure or negative pressure) at the perforation so that the underpressure forms a carrying force to the wafer to be carried.

A further embodiment provides a method for manufacturing the wafer carrier. The method comprises the steps of providing a first foil for carrying the wafer, the first foil having a perforation; and providing a second foil and connecting the first foil and the second foil to each other so as to form a chamber between the first and the second foils. The chamber is configured to be evacuated to form a vacuum in the chamber, the vacuum causes an underpressure at the perforation so that the underpressure forms a carrying force to the wafer to be carried.

A further embodiment provides a method for carrying the wafer. Here, the method comprises the following steps: providing a second foil; providing a first foil for carrying the wafer, the first foil having a perforation; providing the wafer to be carried to the perforation; and connecting the first and the second foils such that an evacuated chamber is formed in between comprising a vacuum, wherein the vacuum causes an underpressure at the perforation such that the underpressure forms a carrying force to the wafer.

BRIEF DESCRIPTION OF THE DRAWINGS

Embodiments of the present invention will subsequently be discussed referring to the enclosed drawings, wherein:

FIG. 1a shows a schematic representation of a wafer carrier according to a first embodiment;

FIG. 1b shows a schematic flow chart illustrating a method for carrying a wafer according to a second embodiment;

FIG. 2 shows a schematic representation of a wafer carrier according to an enhanced embodiment;

FIG. 3a shows a schematic representation of a wafer attached to a wafer carrier;

FIG. 3b shows a schematic cross-section of the wafer of FIG. 3a in combination with the wafer carrier during a main step of the method for carrying the wafer/during the step of fastening the wafer carrier; and FIG. 4 shows a schematic flowchart illustrating the method for manufacturing the wafer carrier.

DETAILED DESCRIPTION OF ILLUSTRATIVE EMBODIMENTS

Below, embodiments of the present invention will subsequently be discussed referring to the enclosed figures, wherein identical reference numerals are provided to objects or elements having the same or similar function so that the description thereof is mutually applicable and interchangeable.

FIG. 1 shows a wafer carrier 10 comprising a first foil 12 and a second foil 14. The two foils 12 and 14 are connected to each other, e.g. via their edges 13e such that a chamber 18 is formed in between.

In detail, the two foils 12 and 14, which may have the shape of a square or a round shape, are connected to each other like a sandwich structure. For example, the two foils 12 and 14 may be connected by a rolling connection (cf. reference numeral 13e) surrounding the chamber 18 such that the volume within the chamber 18 is encapsulated. Consequently, the chamber 18 would be airproof with exception of the perforation 12p.

Here, the chamber 18 is illustrated as a chamber being filled with a gas, like air. In the case of evacuating the chamber 18, an underpressure at the perforation 12p is caused, wherein the wafer 16 is attached to the first foil 12 in a manner such that the perforation 12p is completely covered, a carrying force $F_c$ to the wafer 16 is generated due to the underpressure. Vice versa, this means that the wafer 16 may be carried by generating a vacuum within the chamber 18. Due to the fact that the wafer 16 covers the perforated portion 12p, the chamber 18 is sealed. This results in the situation that the vacuum is maintained when the wafer 16 is attached to the first foil 12. Thus, the wafer remains attached to the wafer carrier 10. This enables that the wafer 16 may be carried using wafer carrier 10 for several hours or days, wherein the following sequence of steps is used for the "attaching procedure", which will be discussed with respect to FIG. 1b.

FIG. 1b shows a flowchart of the method 100 comprising the four basic 102, 104, 106 and 108. The first step 102 is to provide the second foil 14, wherein the second step 104 is to provide the first foil 12 having the perforation 12p. These two foils 14 and 12 are provided on top of each, wherein at this point both are not connected. After that, the third step 106 is performed, namely providing the wafer 16 to the first foil or, in more detail, to the perforation 12p. Starting from this point, the chamber 18 between the two foils 14 and 12 is filled with gas, wherein the perforation 12p is sealed by the wafer 12.

Now, two steps belonging together may be performed in parallel or in series, as illustrated by the step 108. During the step 108 the chamber 18 is created (cf. step 108a) in order to generate an underpressure at the perforation 12p holding the wafer 16 using the carrying force. In order to maintain the vacuum within the chamber 18 after performing the method 100, the two foils 12 and 14 are connected to each other, e.g. using welding, such that the chamber 18 is encapsulated (cf. step 108b).

Due to the maintaining of the vacuum inside the chamber 18 the shown carrier 10 enables to carry a wafer for a long period, e.g. five hours or five days or even one or two weeks without the usage of adhesive means. Further advantages are that a wafer carried by a first carrier 10 may be switched to a second carrier easily, since releasing the wafer just comprises the step of removing the vacuum within the chamber and not to release an adhesive connection.

With respect to the above described method 100 it should be noted that the two steps 108a and 108b may be performed in parallel or in series or in a mixed manner, e.g. connecting the two foils 12 and 14 with the exception of a smaller portion, evacuating the chamber via the small portion and closing the small portion after the evacuation.

With respect to the two above embodiments regarding the wafer carrier and the method for carrying the wafer, it should be noted that these are the basic implementation, wherein improvements, e.g. with respect to the chamber or with respect to the question how to evacuate the chamber, are feasible. FIG. 2 shows an implementation of the wafer carrier enabling these advantages.

FIG. 2 shows a wafer carrier 10' comprising a first perforated foil 12, also referred to as perforated inlet air foil 12, the second foil 14, also referred to as extraction foil 14, and means 25 for structurally supporting the carrier 10'. The means 25 may comprise a grid or a porous plate being arranged between the first foil 12 and the second foil 14, i.e. in the chamber 18 formed between the two foils. Due to the fact that the grid 25 or the porous plate 25 are permeable to air, it forms a volume (for a gas) enabling that the chamber 18 or, to be exact, the volume (18) can be evacuated.

Just for the sake of completeness, it should be noted that the first foil 12 also has the perforation portion 12p by which the wafer 16, e.g. a silicon wafer, is carried using the force $F_c$. Additionally, here the second foil 14 has a perforation within the edge area marked by the reference numeral 14p. In case of evacuating the chamber 18 the evacuation may be performed via the perforation 14p, as will be discussed with respect to FIG. 3.

The wafer carrier 10' has the advantage that the carrier 10' has an improved stability and good stiffness, such that a carried wafer 16 may be processed easily. For example, the carrier 10' may be used for carrying a wafer 16 during further manufacturing processes like a thinning process using a CMP-machine. Another advantage is that also a broken wafer 16 or fragment of a wafer 16 may be carried due to the increased carrying surface defined by the perforated area 12p.

According to further embodiments, the means 25 for structurally supporting the wafer carrier may be formed by a so-called substrate carrier 25. According to a first embodiment, the substrate carrier 25 comprises a substrate-supporting region for supporting a substrate; wherein a first portion of the substrate-supporting region comprises a pore network of at least partially interconnected pores; wherein a second portion of the substrate-supporting region surrounds the first portion and comprises a sealing member for providing a contact sealing; at least one evacuation port for creating a vacuum in the pore network, such that a substrate received over the substrate-supporting region is adhered by suction; and at least one valve configured to control a connection between the pore network and the at least one evacuation port, such that a vacuum can be maintained in the pore network; wherein the pore network comprises a first pore characteristic in a first region and a second pore characteristic in a second region different from the first pore characteristic.

According to an optional embodiment, the carrier substrate 25 may comprise an evacuation line structure coupling the pore network with the at least one evacuation port and comprising at least one of: an evacuation line at least partially extending into the pore network, an evacuation line at least partially surrounding the pore network.

Additionally, the substrate may comprise a recess; and a porous carrier 25 comprising the first portion, wherein the porous carrier 25 is disposed in the recess. The porous carrier 25 may be detachably received in the recess. For example, the substrate carrier 25 may comprise a carrier 25 plate in which the recess is formed. Optionally, the porous carrier 25 physically contacts a bottom of the recess opposite to the substrate supporting region.

According to a further embodiment, the first pore characteristic is greater than the second pore characteristic in at least one of: a spatial pore-density, a spatial pore-size and/or a porosity.

According to further embodiments, a pore network comprises a gradient in a pore characteristic, wherein the gradient is in a direction from the second region to the first region. Alternatively or additionally, the substrate-supporting region may comprise a further pore network of at least partially interconnected pores, wherein the pore network and the further pore network are spatially separated from each other.

According to a further embodiment, the first portion comprises at least one of the following materials: a metal, a ceramic, a glass and/or a polymer.

Below, the evacuation of the wafer carrier 10' will be described with respect to FIGS. 3a and 3b.

FIG. 3a shows the wafer carrier 100' in a three-dimensional view. As can be seen, the wafer carrier 10' comprises the foil cover 12+14 and the structural supporting means 25 enclosed in the foil cover 12+14. The structural support means 25 has a smaller diameter than the foil cover 12+14 comprising the first foil 12 and the second foil 14. Furthermore, the porous plate 25 has preferably, but not necessary, a reduced diameter when compared to the diameter of the wafer 16, i.e. 145 mm for a 150 mm wafer or 290 mm for a 300 mm wafer. Additionally, it should be noted that the first foil 12 is preferably as large as the second foil 14 in order to simplify the connection process of the two foils 12 and 14 as will be discussed with respect to FIG. 3b.

FIG. 3b shows a cross section through the wafer carrier 10'. The layer of the cross section is illustrated in FIG. 3a by the arrow A. As can be seen in FIG. 3b, the two foils 12 and 14 form a sandwich, wherein the support means 25 is arranged in between. The two foils 12 and 14 are directly in contact with each other at the edge region marked by the reference numeral 12_14_e, in which the welding is performed.

Furthermore, the layer stack comprising the layers 12, 25 and 14 is held by an apparatus performing the evacuation and the welding. In detail, the second foil 14 is provided to a plate of the apparatus marked by the reference numeral 30. After providing the second foil 14, the plate 25 as well as the foil 12 is provided to the second foil 14 before the wafer 16 is provided to the foil 12 within the perforated area 12*p*.

According to embodiments, the plate 30 may comprise a ring-shaped nozzle 30*n*. This nozzle 30*n* is arranged within the edge region of the plate 30. Due to the nozzle 30*n*, the plate 30*o* has a cavity into which the wafer carrier 10' can be inlaid such that lateral displacement of the wafer carrier 10' can be avoided during the process of evacuating same and/or welding same. Within a portion of the nozzle 30*n*, a small channel 30*c* is arranged via which the chamber 18 (comprising the grid or porous plate 25) can be evacuated, as illustrated by the arrow marked by the reference numeral 32. Due to the evacuation of the chamber 18, the wafer 16 is pulled against and/or attached to the foil 12*p* by the force $F_c$ (cf. arrow marked by $F_c$, resulting from an under pressure at the perforation 12*p*). Here, the extraction of the air from the chamber 18 may be performed via the entire edge region 12_14_*e* or via a small portion of same.

The apparatus further comprises a welding entity 30*w* which can be pressed against the two foils 12 and 14 from the upper side, i.e. from the side opposite to the plate 30. The welding entity 30*w* is arranged within the edge region 12_14_*e*. The welding entity 30*w* may, for example, be configured to perform plastics welding. This welding is performed by the step of pressing the ring-shaped welding entity 30*w* against the two foils 12 and 14 (cf. arrow 34) in the edge region 12_14_*e*, wherein the ring-shaped welding entity 30*w* puts energy into the edge region 12_14_*e*, e.g. pressure energy, thermal energy (using a resistor heater), inductive energy or ultrasonic energy. Preferably the thermal heating and the pressing is performed simultaneously such that the material of the two foils 12 and 14 form a conjunction or connection. Expressed in other words, this means that the welding entity 30*w* is configured to perform ultrasonic welding, inductive welding, thermic welding, friction welding process or another welding type enabling to connect the two foils 12 and 14 within the edge region 12_14_*e*, wherein the other welding type may be selected in dependency on the materials of the two foils 12 and 14.

Alternatively, the connection of the foils 12 and 14 may be made by a gluing process which comprises the substep of arranging an adhesive (glue) between the two foils 12 and 14.

After evacuating the chamber 18 and connecting the two foils 12 and 14, the vacuum and thus the force $F_c$ is maintained. Due to the force $F_c$, the wafer can be carried and the wafer carrier 10' together with the wafer 16 can be removed from the apparatus 30, wherein the means 25 for structurally supporting the wafer carrier 10' improve the handling due to the increased stiffness of the entity. Now, the wafer 16 may be processed, e.g. by using thinning technologies or other semiconductor technologies. After processing, the wafer 16 may be removed from the carrier 10' by opening the chamber 18, e.g. in such a manner that the second foil 14 is cut. As a consequence of the opening of the chamber 18, the force $F_c$ does not affect the wafer 16 anymore. Vice versa, this means that the wafer carrier 10 or 10' is designed as product for one-time usage.

According to further embodiments, the second foil 14 is perforated within the edge region 12_14_*e* so that the chamber 18 can be evacuated via this perforation and does not have to be evacuated via a channel formed between the two foils 12 and 14, as illustrated by the embodiment of FIG. 3*b*.

According to an alternative embodiment, the two foils 12 and 14 are not connected to each other via welding, but using a zip, wherein a first portion of the zip is formed or integrated into the foil 12 and the second portion of the zip is integrated into the second foil 14. With respect to the above embodiments, it should be noted that the perforation 12*p* is preferably smaller than the wafer to be carried, i.e. has a diameter of 280 mm in the case of carrying a 300 mm wafer or 140 mm in the case of carrying a 150 mm wafer. Furthermore, it should be noted that the two foils 12 and 14 are preferably larger than the wafer, i.e. 320 mm or 160 mm depending on the wafer size. Other wafer and wafer carrier size combinations are possible.

Another embodiment provides a method for manufacturing a wafer carrier which will be illustrated with respect to FIG. 4.

FIG. 4 shows a flowchart illustrating the method 200 for manufacturing a wafer carrier. The method comprises the first step 104, the second step 102 and a third step 206. The steps 102 and 104 are equal to the steps of the method 100, as discussed with respect to FIG. 1*b*. The step 206 refers to the step of connecting the first and the second foils so as to form a chamber between the first and the second foil. Here, the two foils are connected in a manner such that the chamber 18 can be evacuated afterwards. Optionally, the method may comprise a step of integrating the above discussed grid or porous wafer into the chamber 18.

Although some aspects have been described in the context of an apparatus, it is clear that these aspects also represent a description of a corresponding method, where a block or device corresponds to a method step or a feature of a method step. Analogously, aspects described in the context of the method steps also represent a description of a corresponding block or item of a feature of a corresponding apparatus. Some or all of the method steps may be executed by (or using) a hardware apparatus.

The above described embodiments are merely illustrative of the principles of the present invention. It is understood that modifications and variations of the arrangements and the details described herein will be apparent to others skilled in the art. It is therefore the intent be limited only by the scope of the impending patent claims and not by the specific details presented by way of description and explanation of the embodiments herein.

What is claimed is:
1. A wafer carrier comprising:
   a first foil comprising a perforation and configured to carry a wafer;
   a second foil; and
   a chamber between the first foil and the second foil, wherein the first foil and the second foil are connected to each other so as to form the chamber,
   wherein the chamber is configured to be evacuated to form a vacuum in the chamber so that the vacuum causes an underpressure at the perforation to provide a carrying force to the wafer, and
   wherein the first and second foils are connected to each other using a common edge surrounding the chamber.
2. The wafer carrier according to claim 1, wherein the first and second foils are structurally supported.
3. The wafer carrier according to claim 2, wherein a grid or a porous plate is arranged between the first and second foils to structurally support the first and second foils.

4. The wafer carrier according to claim 1, wherein the first and second foils are connected to each other such that the vacuum within the chamber is maintained when the wafer is carried.

5. The wafer carrier according to claim 1, wherein the common edge comprises a welded portion connecting the first and second foils and encapsulating the chamber.

6. The wafer carrier according to claim 1, wherein the common edge comprises a zip connecting the first and second foils and encapsulating the chamber.

7. The wafer carrier according to claim 1, wherein the first foil and/or the second foil has a diameter which is larger than the diameter of the wafer to be carried.

8. The wafer carrier according to claim 1, wherein a diameter of the first foil complies with a diameter of the second foil.

9. The wafer carrier according to claim 1, wherein the wafer carrier is configured to carry the wafer directly on the first foil.

10. A wafer carrier comprising:
   a first foil comprising a perforation and configured to carry a wafer;
   a second foil; and
   a chamber between the first foil and the second foil, wherein the first foil and the second foil are connected to each other so as to form the chamber,
   wherein the chamber is configured to be evacuated to form a vacuum in the chamber so that the vacuum causes an underpressure at the perforation, the underpressure configured to hold a wafer directly on the perforation, and
   wherein the first and second foils are connected to each other using a common edge surrounding the chamber.

11. The wafer carrier according to claim 10, wherein a grid or a porous plate is arranged between the first and second foils to structurally support the first and second foils.

12. The wafer carrier according to claim 10, wherein the common edge comprises a welded portion connecting the first and second foils and encapsulating the chamber.

13. The wafer carrier according to claim 10, wherein the common edge comprises a zip connecting the first and second foils and encapsulating the chamber.

14. The wafer carrier according to claim 10, wherein the first foil and/or the second foil has a diameter which is larger than the diameter of the wafer to be carried.

15. A wafer carrier comprising:
   a first foil comprising a perforation and configured to carry a wafer;
   a second foil; and
   a chamber between the first foil and the second foil, wherein the first foil and the second foil are connected to each other so as to form the chamber,
   wherein the chamber is configured to be evacuated to form a vacuum in the chamber so that the vacuum causes an underpressure configured to hold a wafer without an adhesive on the first foil, and
   wherein the first and second foils are connected to each other using a common edge surrounding the chamber.

16. The wafer carrier according to claim 15, wherein a grid or a porous plate is arranged between the first and second foils to structurally support the first and second foils.

17. The wafer carrier according to claim 15, wherein the common edge comprises a welded portion connecting the first and second foils and encapsulating the chamber.

18. The wafer carrier according to claim 15, wherein the common edge comprises a zip connecting the first and second foils and encapsulating the chamber.

* * * * *